(12) United States Patent
Oosono et al.

(10) Patent No.: US 7,791,275 B2
(45) Date of Patent: Sep. 7, 2010

(54) ORGANIC ELECTROLUMINESCENCE ELEMENT AND MANUFACTURING METHOD OF THE SAME

(75) Inventors: Tetsuo Oosono, Tokyo (JP); Akio Nakamura, Tokyo (JP)

(73) Assignee: Toppan Printing Co., Ltd. (JP)

( * ) Notice: Subject to any disclaimer, the term of this patent is extended or adjusted under 35 U.S.C. 154(b) by 883 days.

(21) Appl. No.: 11/704,077

(22) Filed: Feb. 7, 2007

(65) Prior Publication Data

US 2007/0228944 A1    Oct. 4, 2007

(30) Foreign Application Priority Data

Mar. 30, 2006    (JP) .............................. 2006-093499

(51) Int. Cl.
*H05B 33/00* (2006.01)
*H01J 1/62* (2006.01)

(52) U.S. Cl. ..................................................... 313/512
(58) Field of Classification Search .......... 313/498–512
See application file for complete search history.

(56) References Cited

U.S. PATENT DOCUMENTS

| 6,420,200 B1 | 7/2002 | Yamazaki et al. |
| 6,582,504 B1 | 6/2003 | Fujita |
| 2004/0021413 A1 | 2/2004 | Ito et al. |

FOREIGN PATENT DOCUMENTS

| JP | 05-078655 | 3/1993 |
| JP | 10-012377 | 1/1998 |
| JP | 10-077467 | 3/1998 |
| JP | 11-024604 | 1/1999 |
| JP | 2001-076873 | 3/2001 |
| JP | 2001-093668 | 4/2001 |
| JP | 2001-155858 | 6/2001 |
| JP | 2001-155861 | 6/2001 |
| JP | 2001-185360 | 7/2001 |
| JP | 2001-291587 | 10/2001 |
| JP | 2002-100472 | 4/2002 |
| JP | 2002-305077 | 10/2002 |
| JP | 2002-313561 | 10/2002 |

(Continued)

OTHER PUBLICATIONS

D.H. Zhang, et al., "Influence of Silane Partial Pressure on the Properties of Amorphous SiCN Films Prepared by ECR-CVD" *Thin Solid Films* 377-378 (2000), pp. 607-610.

*Primary Examiner*—Joseph L Williams
(74) *Attorney, Agent, or Firm*—Squire, Sanders & Dempsey L.L.P.

(57) ABSTRACT

The present invention provides an organic EL element on which a protective film, which can be thickened and has a high barrier property, can be formed with high productivity, and a method of manufacturing the same. An organic electroluminescence element having a substrate 1, a first electrode 2 provided thereon, an organic luminescent layer 3, a second electrode 4, and a protective film 5 in this order, wherein the protective film 5 is formed with carbon-containing silicon nitride (SiNxCy), and the carbon content in the protective film 5 is continuously altered. The protective film of the element is formed by using an organic silicon compound, and nitrogen and hydrogen as a source gas, with a plasma CVD method while altering the voltage.

4 Claims, 1 Drawing Sheet

FOREIGN PATENT DOCUMENTS

| | | |
|---|---|---|
| JP | 2003-059654 | 2/2003 |
| JP | 2003-059656 | 2/2003 |
| JP | 2003-243163 | 8/2003 |
| JP | 2003-282237 | 10/2003 |
| JP | 2003-282244 | 10/2003 |
| JP | 2004-055333 | 2/2004 |
| JP | 2004-063359 | 2/2004 |
| JP | 2004-355913 | 12/2004 |
| WO | WO 99/10862 | 4/1999 |

ORGANIC ELECTROLUMINESCENCE ELEMENT AND MANUFACTURING METHOD OF THE SAME

CROSS REFERENCE

This application claims priority to Japanese application number 2006-093499, filed on Mar. 30, 2006, which is incorporated by reference.

BACKGROUND OF THE INVENTION

1. Field of the Invention

The present invention relates to an organic electroluminescence element used in displays and other luminescent displays of a predetermined pattern and the like, and a method of manufacturing the same.

2. Description of the Related Art

Organic electroluminescence elements are elements including at least an anode, an organic luminescent layer and a cathode on a substrate in which light emission is allowed by impressing an electric field between the electrodes to inject electrons and holes into the organic luminescent layer. Because they are self-emitting elements, displaying can be executed even though a backlight is not used as in the case of liquid crystal displays. Also, because of the simple structure, thin and light weight elements can be produced. Therefore, investigations have been actively carried out at present.

In typical constructions of the organic electroluminescence element, a transparent electrode such as ITO (Indium-Tin-Oxide) is patterned to give a desired shape on a transparent substrate such as glass, and an organic layer is formed thereon, followed by further forming a cathode thereon. The cathode and the organic materials are extremely reactive to water or oxygen, and as a consequence of occurrence of the reaction, non-light emitting spots, referred to as "dark spots" are generated. Accordingly, it was disadvantageous in that life time of the organic electroluminescence element may be shortened.

Hence, in general, a method in which water vapor, oxygen or the like is blocked by adhering a relatively thick glass processed to have a concave shape at the center thereof (hereinafter, referred to as counter bored glass) with an adhesive such as an epoxy resin such that top part of the cathode is covered, as demonstrated in Patent Document 1 has been carried out. However, according to this technique in which the counter bored glass is used, an advantage of enabling thin-modeling which is intrinsic to organic electroluminescence elements cannot be sufficiently made.

In addition, as information visual display terminals, displays having a greater size and greater number of picture elements, exhibiting a higher response speed, and being accompanied by smaller electric power consumption have been desired. To deal with these matters, it has been believed that a top emission structure, generally referred to, is essential in which the organic EL element is constructed using a thin film transistor (TFT) to provide a so called active matrix driving system, and the light is extracted from the opposite side of the TFT substrate. For attaining such a top emission structure, it was structurally impossible to extract the light from the top face when it was sealed with a metal can or a counter bored glass.

Accordingly, as set out in Patent Document 2, a method in which a polymer film with a transparent barrier film is allowed to cover on the electrode was proposed, however, when the covering is carried out by coating with a polymer film, formation of a thin film is required for improving the water vapor permeability of the polymer film itself, which may lead to increase in number of production steps. In addition, it may result in inclusion of bubbles upon attaching, and thus the element may be damaged by a slight amount of active gas in the bubble.

Additionally, a structure of sealing the organic electroluminescence element by formation with metal nitride, metal oxide or the like was proposed. Such a silicon oxide film or silicon nitride film is usually produced by a plasma CVD, sputtering method or the like. Furthermore, the protective film produced by the aforementioned method may cause film stripping due to the stress of the film itself when it is produced under a condition to permit film thickening or formation of a compact film for the purpose of improving the barrier property, and consequently the element may be broken. In order to solve the aforementioned problems, lamination of the aforementioned thin film and the organic film as suggested in Patent Document 3 was proposed. However, the process is disadvantageous in that formation of the protective film takes a long time, or it is not suited for production on a large scale because the film production cannot be perfected in single operation.

As in the foregoing, it was difficult to produce a thick film as the protective film used for improving the durability or reliability of conventionally proposed organic electroluminescence elements. Therefore, production of a pinholeless film having a high barrier property by the film alone was difficult, and further, demands for high productivity such as possible completion of forming the protective film by single film producing operation were not satisfied enough.

Accordingly, an object of the invention is to provide an organic electroluminescence element on which a protective film, which can be thickened and has a high barrier property, can be formed with high productivity, and a method of manufacturing the same.

Patent Document 1: JP-A-H5-109482
Patent Document 2: JP-A-2004-79292
Patent Document 3: JP-A-2003-17244

SUMMARY OF THE INVENTION

The present invention provides an organic EL element on which a protective film, which can be thickened and has a high barrier property, can be formed with high productivity, and a method of manufacturing the same. An aspect of the invention is an organic electroluminescence element comprising a substrate 1, a first electrode 2 provided thereon, an organic luminescent layer 3, a second electrode 4, and a protective film 5 in this order, wherein the protective film 5 is formed with carbon-containing silicon nitride ($SiN_xC_y$), and the carbon content in the protective film 5 is continuously altered. The protective film of the element is formed by using an organic silicon compound, and nitrogen and hydrogen as a source gas, with a plasma CVD method while altering the voltage.

DESCRIPTION OF REFERENCE NUMERALS AND SIGNS

Figure 1:
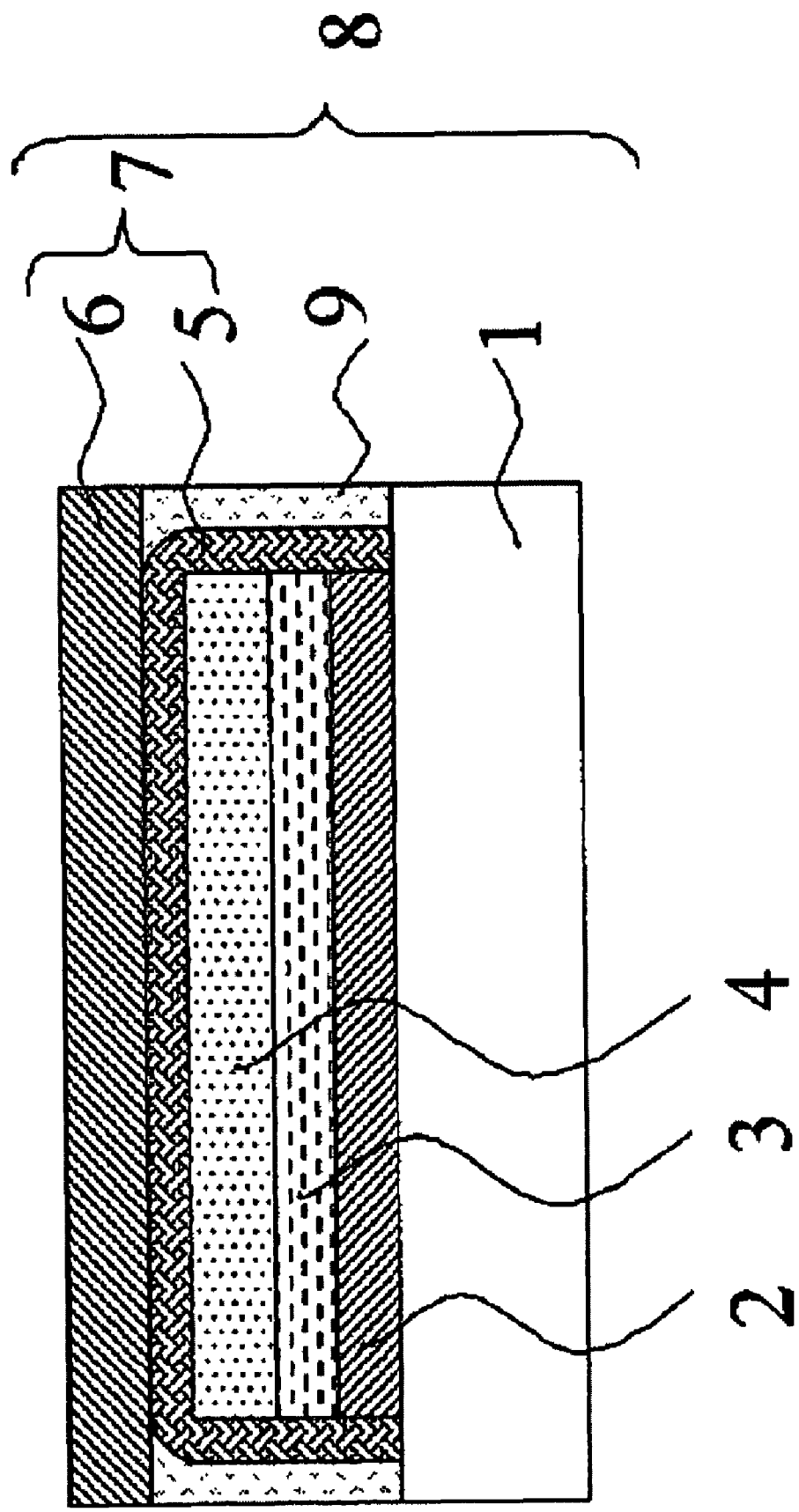
FIG. 1 shows a cross-sectional view for illustrating one example of the organic EL element of the present invention.

1; substrate, 2; anode, 3; organic luminescent layer, 4; cathode, 5; protective film, 6; sealing glass substrate, 7; protective layer, 8; organic electroluminescence element, 9; adhesive

DESCRIPTION OF THE PREFERRED EMBODIMENTS

Hereinafter, the organic electroluminescence element (hereinafter, referred to as "organic EL element") of the present invention will be described in detail.

FIG. 1 shows a cross-sectional view for illustrating one example of the organic EL element of the invention.

The organic EL element has a simple basic structure in which an organic luminescent layer 3 is sandwiched between an anode 2 as the first electrode and a cathode 4 as the second electrode on a substrate 1. Voltage is applied between these electrodes, and the light, which was generated upon recombination of the hole injected from one electrode and the electron injected from another electrode in the organic luminescent layer 3, is used for image display or as a light source.

A protective film 5 and a sealing glass substrate 6 as a protective layer 7 are provided on the cathode 4. The organic EL element of the invention is not limited to the mode as shown in FIG. 1.

In this embodiment, as the substrate 1, any one can be used as long as it has translucency and insulation properties. For example, glass; quartz; a film or sheet of a plastic such as polypropylene, polyether sulfone, polycarbonate, cycloolefin polymer, polyarylate, polyamide, polymethyl methacrylate, polyethylene terephthalate or polyethylene naphthalate; or a translucent substrate produced by laminating metal oxide such as silicon oxide or aluminum oxide, metal fluoride such as aluminum fluoride or magnesium fluoride, metal nitride such as silicon nitride or aluminum nitride, metal oxynitride such as silicon oxynitride, or a film of a polymer resin such as an acrylic resin, an epoxy resin, a silicone resin or a polyester resin to form a monolayer or multilayers on the aforementioned plastic film or sheet; a foil, sheet or plate of a metal such as aluminum or stainless, a nontranslucent substrate produced by laminating a film of a metal such as aluminum, copper, nickel or stainless on the aforementioned plastic film or sheet, or the like may be used.

Also, these substrates may be used as a type of a substrate for driving through forming a thin film transistor (TFT) as needed. The material of TFT which may be used is any one for an organic TFT such as polythiophene, polyaniline, copper phthalocyanine or a perylene derivative, and one for an amorphous silicon or polysilicon TFT.

Further, it is more preferred that these substrates are subjected to a heat treatment beforehand so as to minimize the amount of the water vapor adsorbed inside or on the surface as low as possible. Furthermore, for improving the adhesion properties depending on the material laminated on the substrate, they are preferably subjected to a surface treatment such as an ultrasonic cleaning treatment, a corona discharge treatment, a plasma treatment or a UV ozone treatment. Moreover, these substrates may be provided with a color filter layer, a light scattering layer, a light deflecting layer and the like as needed.

First, film formation of the anode 2 as the first electrode is carried out on the substrate 1, followed by patterning as needed (FIG. 1). In this step, the material of the anode 2 which can be used is any one of: metal complex oxides such as ITO (indium-tin complex oxide), indium-zinc complex oxide and zinc-aluminum complex oxide; metal materials such as gold and platinum; and fine grain dispersion films produced by dispersing fine grains of such a metal oxide or a metal material in an epoxy resin or an acrylic resin and laminating the dispersion to form a monolayer or multilayers. In addition, for reducing the wiring resistance of the anode 2 as needed, a metal material such as copper or aluminum may be placed in conjunction as an auxiliary electrode. The method of forming the anode 2 which can be employed may be, depending on the material, a dry film formation method such as a resistance heating evaporation coating method, an electron beam-evaporation coating method, a reactive deposition method, an ion plating method or a sputtering method, a wet film formation method such as a gravure printing method or a screen printing method, or the like. The method of patterning the anode 2 which can be employed may be, depending on the material and the method of the film formation, a known patterning method such as a mask evaporation coating method, a photolithography method, a wet etching method or a dry etching method.

Next, the organic luminescent layer 3 is formed (FIG. 1). The organic luminescent layer 3 according to the invention can be formed as a monolayer film or a multilayer film containing a luminescent material. Examples of the construction in which it is formed as the multilayer film include: bilayer constructions including a hole transport layer and an electron transporting luminescent layer, or the hole transporting luminescent layer and an electron transport layer; and triple layer constructions including a hole transport layer, a luminescent layer and an electron transport layer. Still more preferably, further more layer construction may be formed by separating the hole (electron) injection function and the hole (electron) transport function as needed, or by inserting a layer which blocks the transport of the hole (electron) or the like.

Examples of the hole transport material can be selected from among metal phthalocyanines such as copper phthalocyanine and tetra(t-butyl)copper phthalocyanine, nonmetal phthalocyanines, quinacridone compounds, aromatic amine-based low-molecular hole injection transport materials such as 1,1-bis(4-di-p-tolylaminophenyl)cyclohexane, N,N'-diphenyl-N,N'-bis(3-methylphenyl)-1,1'-biphenyl-4,4'-diamine and N,N'-di(1-naphthyl)-N,N'-diphenyl-1,1'-biphenyl-4,4'-diamine, high-molecular hole transport materials such as polyaniline, polythiophene, polyvinylcarbazole and mixtures of poly(3,4-ethylenedioxythiophene) with polystyrenesulfonic acid, polythiophene oligomer materials, and other preexisting hole transport materials.

Examples of the luminescent material which can be used include low-molecular luminescent materials such as 9,10-diarylanthracene derivatives, pyrene, coronene, perylene, rubrene, 1,1,4,4-tetraphenylbutadiene, tris(8-quinolinolate) aluminum complexes, tris(4-methyl-8-quinolinolate) aluminum complexes, bis(8-quinolinolate) zinc complexes, tris(4-methyl-5-trifluoromethyl-8-quinolinolate) aluminum complexes, tris(4-methyl-5-cyano-8-quinolinolate) aluminum complexes, bis(2-methyl-5-trifluoromethyl-8-quinolinolate) [4-(4-cyanophenyl)phenolate]aluminum complexes, bis(2-methyl-5-cyano-8-quinolinolate)[4-(4-cyanophenyl)phenolate]aluminum complexes, tris(8-quinolinolate) scandium complexes, bis[8-(para-tosyl)aminoquinoline]zinc complexes and cadmium complexes, 1,2,3,4-tetraphenylcyclopentadiene, pentaphenylcyclopentadiene, poly-2,5-diheptyloxy-para-phenylenevinylene, coumarin fluorescent materials, perylene fluorescent materials, pyran fluorescent materials, anthrone fluorescent materials, porphyrin fluorescent materials, quinacridone fluorescent materials, N,N'-dialkyl-substituted quinacridone fluorescent materials, naphthalimido fluorescent materials and N,N'-diaryl-substituted pyrrolopyrrole fluorescent materials, and phosphorescent illuminants such as Ir complexes; polymer materials such as polyfluorene, polyparaphenylenevinylene, polythiophene and polyspiro; materials obtained by allowing such a polymer material to be dispersed in or copolymerized with the aforementioned low molecular material; and other preexisting luminescent materials.

Examples of the electron transport material which can be used include, 2-(4-biphenylyl)-5-(4-t-butylphenyl)-1,3,4-oxadiazole, 2,5-bis(1-naphthyl)-1,3,4-oxadiazole, oxadiazole derivatives, bis(10-hydroxybenzo[h]quinolinolate) beryllium complexes, triazole compounds and the like. The organic luminescent layer 3 has a film thickness of equal to or less than 1000 nm, and preferably 50 to 150 nm in either case in which it is formed as a monolayer or by lamination. Particularly, the hole transport material of the polymer EL element has a great effect to cover the surface protrusion of the substrate and the anode layer, and film formation to give a thick film of approximately 50 to 100 nm is more preferred.

The method of forming the organic luminescent layer 3 which can be employed may be, depending on the material, a vacuum evaporation method, a coating method such as spin coating, spray coating, flexo, gravure, microgravure or intaglio offset, or a printing method as well as ink jet method or the like. When the polymer organic luminescent layer is solubilized, it is preferred to control the vapor pressure, solid content ratio, viscosity and the like of the solvent, depending on the method of formation. The solvent may be either single solvent alone such as water, xylene, anisole, cyclohexanone, mesitylene, tetralin, cyclohexylbenzene, methyl benzoate, ethyl benzoate, toluene, ethanol, acetone, methyl ethyl ketone, methyl isobutyl ketone, methanol, isopropyl alcohol, ethyl acetate or butyl acetate, or a mixed solvent thereof. Also, for the purpose of improving the coating performance, it is more preferred to blend an additive such as a surfactant, an oxidization inhibitor, a viscosity modifier or an ultraviolet absorbent in an appropriate amount as needed. Drying method of the coating liquid may be any one that can exclude the solvent to the extent that the EL characteristics are not deteriorated, and may be any one carried out by heating, depressurizing, and heating in vacuum.

Next, the cathode 4 as the second electrode is formed (FIG. 1). As the material of the cathode 4, a substance having high electron injection efficiency to the organic luminescent layer 3 may be used. Specifically, an elemental metal such as Mg, Al or Yb may be used. Alternatively, Al or Cu having excellent stability and electric conductivity may be laminated on the boundary being in contact with the optical gain medium so that a compound such as Li, Li oxide or LiF is interposed to give a thickness of 1 nm. Alternatively, for the purpose of achieving both electron injection efficiency and stability, an alloy system of one or more metals having a low work function such as Li, Mg, Ca, Sr, La, Ce, Er, Eu, Sc, Y or Yb with a stable metal element such as Ag, Al or Cu may be also used. Specifically, an alloy such as MgAg, AlLi or CuLi can be used. In the case of use of the cathode 4 as a translucent electrode layer for injecting the electron, Li or Ca having a low work function may be provided to give a thin film, and thereafter, a metal complex oxide such as ITO (indium-tin complex oxide), indium-zinc complex oxide or zinc-aluminum complex oxide may be laminated, or after doping the metal having a low work function such as Li or Ca in a small amount in the organic luminescent layer 3, the metal oxide such as ITO may be laminated.

The method of forming the cathode 4 which can be employed may be, depending on the material, a resistance heating evaporation coating method, an electron beam-evaporation coating method, a reactive deposition method, an ion plating method, or a sputtering method. Although the thickness of the cathode 4 is not particularly limited, it is desirably approximately 10 nm to 1000 nm. In addition, in the case of use of the cathode 4 as a translucent electrode layer when the metal material such as Ca or Li is used, the film thickness is desirably approximately 0.1 to 10 nm.

The protective layer 7 is formed on thus formed cathode 4. The protective layer 7 includes the protective film 5 and the sealing glass substrate 6, and plays a role in protecting the cathode metal and the organic EL element 8 from external water vapor, oxygen, other mechanical damage and the like, thereby preventing the deterioration.

As the protective film 5, a film which is formed with carbon-containing silicon nitride (SiNxCy) and has continuously varying carbon content in the protective film may be used. By allowing the carbon content to vary, the film having a high carbon content becomes soft thereby yielding the film that is excellent in coverage and adhesion properties, while the film having a low carbon content results in the film having a high density and high barrier properties. With respect to the amount of carbon, it is desired that ratio of the amount of carbon becomes less than 1.0 when Si is postulated to be 1 because when the carbon content becomes 1.0 or greater, the film may be colored or brittle. Preferably, the layer having such a varying composition is present in multiple numbers repeatedly. According to thus repeated presence of the layers, the protrusion which could not be covered by one layer alone can be covered, and an effect to relax the crack generated on the first layer is expected. Accordingly, a film having higher barrier properties can be obtained.

In a suitable mode of the invention, a layer having the amount of nitrogen and carbon included in the carbon-containing silicon nitride (SiNxCy) which constitutes the protective film falling within the range of $1.0 \leq x \leq 1.4$, and $0.2 \leq y \leq 0.4$;

and a layer having the amount thereof falling within the range of $0.4 \leq x \leq 1.0$, and $0.4 < y < 1.0$ are preferably included.

According to this mode, stress relaxation ability, adhesiveness on the substrate surface, and favorable gas barrier characteristics can be imparted in combination, whereby protective characteristics of the element can be improved.

Upon film production of this carbon-containing silicon nitride (SiNxCy), a plasma CVD method may be used. In the plasma CVD method, the reactions by which film producing seeds are generated are all conducted in a gas phase. Therefore, it is a film production method most suited for the low temperature film production because of no need of causing the reaction on the substrate surface.

One illustrative example of the method of continuously altering the carbon content in the protective film may be a method in which an organic silicon compound, either one or both of ammonia and nitrogen, and hydrogen are used as a source gas to conduct the plasma CVD method. For example, by applying higher electric power, the carbon content in the film can be reduced.

Furthermore, a method in which the plasma CVD method is conducted using silane, either one or both of ammonia and nitrogen, hydrogen, and a carbon-containing gas as a source gas, while altering the content of the carbon-containing gas may be exemplified. In this case, the composition can be controlled by altering the flow rate of the carbon-containing gas during the film production. Alternatively, it is desired to arbitrarily regulate by a parameter such as substrate temperature, gas pressure or the like in film production.

Examples of the organic silicon compound include e.g., trisdimethylaminosilane (TDMAS), hexamethyldisilazane (HMDS), hexamethyldisiloxane (HMDSO), tetramethyldisilazane (TMDS) and the like. Examples of the carbon-containing gas include methane, ethylene, propene and the like.

The thickness of each layer of the protective film 5 is not particularly limited, but is desirably approximately 100-500 nm, and in its entirety, the thickness is preferably approximately 1000 nm or less. When the thickness falls within this range, defects in the film itself such as a pinhole can be compensated, whereby the barrier property against penetration of oxygen or water vapor can be greatly improved. Furthermore, the film production can be perfected in a short period of time, and extraction of the light from the organic luminescent layer 3 is not hindered. Moreover, when the carbon content is altered to be high on the cathode 4 side and be reduced as the distance from the cathode 4 increases, further improvement of the adhesion properties and coatability is expected.

Next, the sealing glass substrate 6 is attached to the protective film 5. By attaching the glass substrate, the barrier property is further improved, and in addition, durability against mechanical damage which cannot be achieved by the aforementioned protective film 5 alone can be imparted.

When the sealing glass substrate 6 is attached, an adhesive may be coated uniformly on the side of the sealing glass substrate 6, or the adhesive may be coated to surround on the circumference (adhesive 9 in FIG. 1). Also, a method in which an adhesive layer formed into a sheet-shape is thermally transferred can be employed. Examples of the material of the adhesive layer include photohardening adhesive resins, thermosetting adhesive resins, two-component hardened adhesive resins containing an epoxy resin, an acrylic resin or a silicone resin, as well as thermoplastic adhesive resins containing an acid modified product of polyethylene or polypropylene, which can be used as a monolayer or a laminated layer. In particular, an epoxy thermosetting adhesive resin which is excellent in water vapor resistance and water resistance, and is accompanied by less contraction in hardening is desirably used. Also, for eliminating the water vapor included inside of the adhesive layer to the extent that transmission of the light through the adhesive layer is not inhibited, a desiccant agent such as barium oxide or calcium oxide may be mixed, or an inorganic filler for controlling the thickness of the adhesive layer may be also mixed in an amount of a few percentages.

Accordingly, thus produced sealing glass substrate 6 with the adhesive is attached, and subjected to each hardening treatment. Although it is desired to carry out these series of processes for forming the protective layer under a nitrogen atmosphere, the circumstance does not greatly affect even in the case of under the ambient air as long as the process is conducted for a short period of time after production of the protective film 5.

According to the invention of claim 1, by continuously carrying out film formation of: a silicon nitride film which is excellent in stress relaxation ability and step coverage, and includes a high amount of carbon; and a silicon nitride film having a high barrier property, an organic electroluminescence element on which a protective film, which can be thickened and has a high barrier property, can be formed with high productivity, without causing stripping due to the film itself because concentration of stress to one part of the film can be prevented.

According to the invention of claim 2, stress relaxation ability, adhesiveness on the substrate surface, and favorable gas barrier characteristics can be all achieved.

According to the invention of claim 3, stress relaxation ability, adhesiveness on the substrate surface, and favorable gas barrier characteristics can be all achieved, and in addition, protective characteristics of the element can be also improved.

According to the invention of claim 4, not only improvement of the protective characteristics against water vapor and oxygen, but also imparting high durability against mechanical damage is enabled.

According to the invention of claim 5, the protective film can be conveniently formed without need of extensive modification of conventionally used apparatus.

According to the invention of claim 6, the protective film can be conveniently formed without need of extensive modification of conventionally used apparatus.

As in the foregoing, the organic electroluminescence element can be conveniently produced which can stably emit light for a long period of time according to the invention.

Hereinafter, the present invention will be explained by way of specific Examples. In these Examples, examples of producing a bottom emission element on the glass substrate 1 are set out, however, the invention is not limited thereto. TFT may be formed as the substrate, or production of a top emission element for extracting the light from the sealing side is also permitted.

EXAMPLE 1

First, on a glass substrate 1 having an ITO film thereon, film formation was carried out using a polythiophene derivative (50 nm) to be a polymer hole transport layer and polyfluorene (80 nm) in this order as an organic luminescent layer 3. The film formation was carried out with water and a dispersed ink in alcohol for the polythiophene derivative, and with an ink dissolved in an aromatic solvent such as toluene for polyfluorene by a spin coating method, respectively.

Next, as the cathode 4, film production was carried out by laminating Ba (810 nm) and Al (100 nm) according to a evaporation coating method. Subsequently, the protective layer 7 was formed. The protective layer 7 is constructed from the protective film 5 and the sealing glass substrate 6. As the protective film 5, a carbon-containing silicon nitride film having a gradient of the composition was produced using methane, monosilane, a nitrogen gas and a hydrogen gas as the source gas by the plasma CVD method. Specifically, after conveying the element under nitrogen, it was transferred to a plasma CVD apparatus. After reducing the pressure in the vacuum chamber to not higher than $10^{-2}$ Pa, silane, nitrogen, methane and hydrogen were introduced as the source gas, whereby the plasma was allowed to be generated at a high frequency wave (13.56 MHz). Over deposition time, the flow rate of the methane gas was decreased to provide a gradient of the composition. The flow rate of the methane gas was cut to zero once, and thereafter the initial amount thereof was introduced again to form the layer structure. The film thickness was 300 nm per the layer among the aforementioned layers. This manipulation was repeated three times to give the protective film 5 having a thickness of 900 nm.

The sealing glass substrate 6 produced by coating a thermally hardening resin on the entire face of the protective film 5 with a die coater was attached to the element substrate using a thermal roll laminator while heating at a temperature of 100° C. After thus attaching, hardening was further executed at 100° C. for 1 hour.

Application of a voltage of 6 V to thus produced organic EL element yielded a luminance of 10000 cd/m². This exhibited a characteristic that is comparable to the element not having the protective film 5 formed thereon. Also, decrease in the luminescence area after leaving this element to stand at 60° C. under 90% RH for 500 hrs and 1000 hrs was 0.5% and 1%, respectively, as represented by a value involving a variation among the picture elements.

EXAMPLE 2

A carbon-containing silicon nitride film having a gradient of the composition which is exactly the same as that of Example 1 was produced without using the sealing glass substrate 6 as the protective layer of Example 1. As a result, application of a voltage of 6 V to the organic EL element yielded a luminance of 10000 cd/m². Also, decrease in the luminescence area after leaving this element to stand at 60° C. under 90% RH for 500 hrs and 1000 hrs was 5% and 10%, respectively, as represented by a value involving a variation among the picture elements.

EXAMPLE 3

As the protective film 5 of Example 1, a carbon-containing silicon nitride film having a gradient of the composition was produced by the plasma CVD method in a similar manner to Example 1 except that hexamethyl disilazane, ammonia, hydrogen gases were used as the source gas. Specifically, after conveying the element under nitrogen and transferring to a plasma CVD apparatus followed by reducing the pressure in the vacuum chamber to not higher than $10^{-2}$ Pa, ammonia, hydrogen gases, hexamethyl disilazane which had been vaporized by heating the solution were introduced as the source gas, whereby the plasma was allowed to be generated at a high frequency wave (13.56 MHz). Over deposition time, the charged electric energy was increased to provide a gradient of the composition. When the electric power reached the value that minimizes the carbon content, electric power was again restored to the initial value to form the layer. The film thickness was 300 nm per the layer among the aforementioned layers. This manipulation was repeated three times to give the protective film 5 having a thickness of 900 nm. As a result, application of a voltage of 6 V to the organic EL element yielded a luminance of 10000 cd/m². This was similar to the case in which the protective film 5 was not formed. Also, decrease in the luminescence area after leaving this element to stand at 60° C. under 90% RH for 500 hrs and 1000 hrs was 5% and 10%, respectively, as represented by a value involving a variation among the picture elements.

The sealing glass substrate 6 produced by coating a thermally hardening resin on the entire face of the protective film 5 with a die coater was attached to the element substrate using a thermal roll laminator while heating at a temperature of 100° C. After thus attaching, hardening was further executed at 100° C. for 1 hour.

Application of a voltage of 6 V to the organic EL element yielded a luminance of 10000 cd/m². This exhibited a characteristic that is comparable to the element not having the protective film 5 formed thereon. Also, decrease in the luminescence area after leaving this element to stand at 60° C. under 90% RH for 500 hrs and 1000 hrs was 1.5% and 3%, respectively, as represented by a value involving a variation among the picture elements.

COMPARATIVE EXAMPLE 1

In Example 1, the silicon nitride film having a thickness of 900 nm was produced as the protective film 5 using monosilane, ammonia, hydrogen and nitrogen by the plasma CVD method. As a result, application of a voltage of 6 V to the organic EL element yielded a luminance of 10000 cd/m². Also, decrease in the luminescence area after leaving this element to stand at 60° C. under 90% RH for 500 hrs and 1000 hrs was 70% and 90%, respectively, as represented by a value involving a variation among the picture elements. This results from time dependent cracking due to the stress in the film leading to penetration of water vapor or oxygen.

COMPARATIVE EXAMPLE 2

In Example 1, the sealing glass substrate 6 alone was attached as the protective layer 7 without using the protective film 5. As a result, application of a voltage of 6 V to the organic EL element yielded a luminance of 10000 cd/m². Also, decrease in the luminescence area after leaving this element to stand at 60° C. under 90% RH for 500 hrs and 1000 hrs was 15% and 25%, respectively, as represented by a value involving a variation among the picture elements. Particularly, the decrease in the area was significant from the end side, revealing that the water vapor barrier characteristics exhibited by the adhesion alone used for the attachment were not sufficient.

What is claimed is:

1. An organic electroluminescence element comprising a substrate, a first electrode provided on the substrate, an organic luminescent layer, a second electrode, and a protective film in this order, wherein the protective film is formed with carbon-containing silicon nitride (SiNxCy), and the carbon content in the protective film is continuously altered.

2. The organic electroluminescence element according to claim 1 wherein the carbon content included in the protective film varies to be high on the second electrode side and be reduced as the distance from the second electrode increases.

3. The organic electroluminescence element according to claim 1 wherein the protective film comprises: a layer having the amount of nitrogen and carbon included in the carbon-containing silicon nitride (SiNxCy) which constitutes the protective film falling within the range of $1.0 \leq x \leq 1.4$, and $0.2 \leq y \leq 0.4$;

and a layer having the amount thereof falling within the range of $0.4 \leq x \leq 1.0$, and $0.4 < y < 1.0$.

4. The organic electroluminescence element according to claim 1 wherein a sealing substrate is further provided on the protective film.

* * * * *